United States Patent [19]
Oshikawa

[11] Patent Number: 4,837,533
[45] Date of Patent: Jun. 6, 1989

[54] LADDER-TYPE CERAMIC FILTER

[75] Inventor: Michitaka Oshikawa, Tsurugashima, Japan

[73] Assignee: Toko Kabushiki Kaisha, Tokyo, Japan

[21] Appl. No.: 221,280

[22] Filed: Jul. 19, 1988

[30] Foreign Application Priority Data

Jul. 22, 1987 [JP] Japan .................. 62-112315[U]

[51] Int. Cl.⁴ ............................................. H03H 9/58
[52] U.S. Cl. .................................... 333/189; 333/190
[58] Field of Search ............. 333/187, 188, 189, 190, 333/191, 192; 310/311, 318-319, 348, 358, 366

[56] References Cited

U.S. PATENT DOCUMENTS 3,460,073  8/1969  Thelen .................. 333/189

Primary Examiner—Marvin L. Nussbaum
Attorney, Agent, or Firm—Stevens, Davis, Miller & Mosher

[57] ABSTRACT

A ladder-type ceramic filter formed of a plurality of series and parallel resonators arranged in series and in parallel between the input and output terminals. In this filter, resonators are arranged in a manner that a resonator (or resonators) in which each difference between resonant and antiresonant frequencies thereof is minimum is (or are) positioned in the center of the resonator arrangement, and that resonators in which respective differences between resonant and antiresonant frequencies thereof are a larger value or values are positioned on the sides of the input and output terminals, respectively.

4 Claims, 2 Drawing Sheets

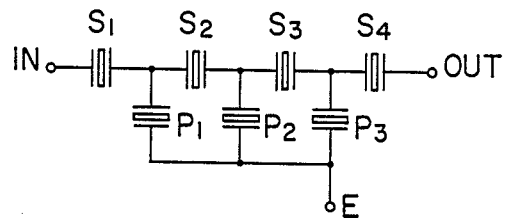
F I G. 4
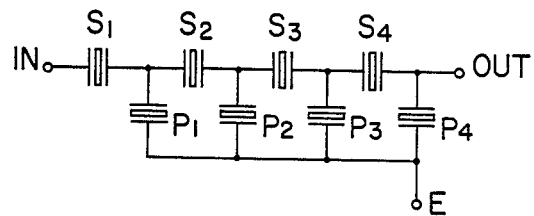
F I G. 5

4,837,533

LADDER-TYPE CERAMIC FILTER

BACKGROUND OF THE INVENTION

[Applied field in industry]

This invention relates to the structure of a ladder-type ceramic filter, and more particularly to a ladder-type ceramic filter in which resonators having different characteristics are arranged.

[Prior art and the problem therewith]

There are used various ladder-type ceramic filters having a high selectivity filter characteristic in which a plurality of resonators consisting of an element made of a piezoelectric material such as barium titanate, are connected in the form of a ladder.

Such ladder-type ceramic filters are constituted by arranging a plurality of resonators connected in series and a plurality of ones connected in parallel between the input and output terminals.

In general, for series and parallel resonators, there are employed resonators having resonant frequencies equal to each other and antiresonant frequencies equal to each other, respectively. In this instance, setting is made such that respective differences $\Delta F$ between the resonant and antiresonant frequencies of the resonators are fixed.

For example, for three series resonators, setting is made such that the resonant and antiresonant frequencies are equal to 455 and 471 KHz, respectively, thus allowing the difference therebetween to be equal to 16 KHz. In addition, for three parallel resonators, setting is made such that the resonant and antiresonant frequencies are equal to 439 and 455 KHz, respectively, thus allowing the difference therebetween to be equal to 16 KHz which is the same value as the difference for the above-mentioned three series resonators. These resonators thus set are used.

The characteristic of the ladder-type ceramic filter thus constituted is shown in FIG. 3. As indicated by the curve 31, the ripple R is large and the pole width W of the attenuation is narrowed. When the ripple R becomes large, the distortion factor is deteriolated, failing to ensure the distortion of the adjacent channel unless the pole width W of the attenuation is sufficient.

As just described above, using resonators having uniform characteristics provides the merit that particular consideration is not taken for the arrangement of resonators, but is questionable to much extent in view of characteristics.

SUMMARY OF THE INVENTION

[Objects]

An object of this invention is to solve the above-mentioned problems, thus to provide a ladder-type ceramic filter having small undulations and excellent characteristics.

Another object of this invention is to increase the number of poles, thus to widen the width of the pole attenuation.

[Means for solving the problems]

This invention contemplates attaining the above-mentioned objects by changing the characteristics of respective resonators constituting a ladder-type ceramic filter.

Particularly, this invention contemplates attaining the above-mentioned objects by changing the difference $\Delta F$ between resonant and antiresonant frequencies.

Namely, this invention is directed to a ladder-type ceramic filter formed of a plurality of series and parallel resonators arranged in series and in parallel between the input and output terminals, characterized in that the resonators constituting the ceramic filter are arranged in a manner that a resonator (or resonators) in which a difference between a resonant frequency and an antiresonant frequency of each resonator is minimum is (or are) positioned in the center of the resonator arrangement, and that resonators in which respective differences between resonant and antiresonant frequencies thereof are a larger value or values are positioned on the sides of the input and output terminals, respectively.

Where the ceramic filter is composed of an odd number of resonators, the resonator positioned in the center of the resonator arrangement is such that a difference between a resonant frequency and an antiresonant frequency thereof is minimum, and resonators in which respective differences between resonant and antiresonant frequencies thereof are a larger value or values are arranged from the resonator positioned in the center of the resonator arrangement toward the sides of the input and output terminals, respectively.

On the other hand, where the ceramic filter is composed of an even number of resonators, the series and parallel resonators positioned in the center of the resonator arrangement are such that respective differences between resonant and antiresonant frequencies thereof are minimum, and resonators in which respective differences between resonant and antiresonant frequencies thereof are a larger value or values are arranged from the series and parallel resonators positioned in the center of the resonator arrangement toward the sides of input and output terminals, respectively.

BRIEF DESCRIPTION OF THE DRAWINGS

In the accompanying drawings:

FIG. 4 is a circuit diagram showing another embodiment of this invention; and

FIG. 5 is a circuit diagram showing still another embodiment of this invention.

DESCRIPTION OF THE PREFERRED EMBODIMENT

A preferred embodiment of this invention will be described with reference to the attached drawings.

Figure 1:
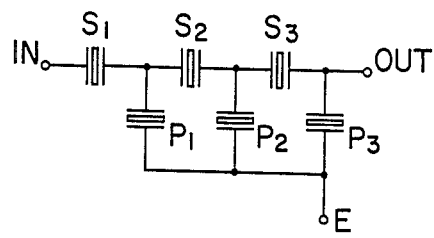
FIG. 1 is a circuit diagram showing an embodiment of a ladder-type ceramic filter according to this invention.

FIG. 1 is a circuit diagram showing the connection arrangement of resonators employed in the embodiment according to this invention. The arrangement is composed of three series resonators $S_1$, $S_2$ and $S_3$ connected between an input terminal IN and an output terminal OUT serially in order recited from the side of the input terminal, and three parallel resonators $P_1$, $P_2$ and $P_3$ parallelly connected between respective interconnections of the series resonators, or interconnection of the series resonator and the output terminal OUT, and the ground respectively and being in order recited also from the side of the input terminal.

The resonant and antiresonant frequencies of all the resonators are not the same, but they are set as follows:

|   | Resonant Frequency | Antiresonant Frequency | ΔF |
| --- | --- | --- | --- |
| $S_1$ | 455 | 480 | 25 |
| $P_1$ | 439 | 455 | 16 |
| $S_2$ | 455 | 468 | 13 |
| $P_2$ | 442 | 455 | 13 |
| $S_3$ | 455 | 471 | 16 |
| $P_3$ | 430 | 455 | 25 |

(In frequency of KHz)

Setting is made such that the differences ΔF between resonant and antiresonant frequencies of the resonators $S_2$ and $P_2$ positioned in the center are 13 KHz. In addition, setting is made such that the differences ΔF between resonant and antiresonant frequencies of the resonators $P_1$ and $S_3$ respectively positioned outside the resonators $S_2$ and $P_2$ are 16 KHz. Namely, resonators $P_1$ and $S_3$ are arranged so that the differences ΔF between resonant and antiresonant frequencies thereof are larger than those of the resonators $S_2$ and $P_2$ positioned in the center.

Similarly, setting is made in the resonators $S_1$ and $P_3$ positioned on the outermost sides such that both differences ΔF between resonant and antiresonant frequencies thereof are 25 KHz. Namely, these resonators $S_1$ and $P_3$ are set so that they have frequency differences ΔF larger than those of the resonators positioned inside.

Figure 2:
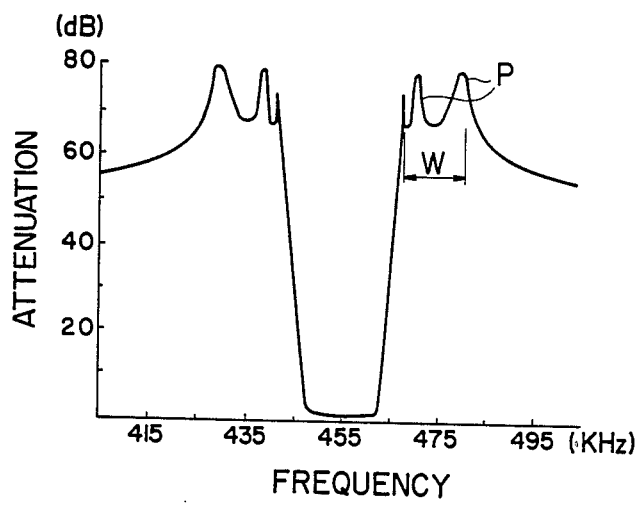
FIG. 2 is a view for explaining the characteristic of the ladder-type ceramic filter shown in FIG. 1.
Figure 3:
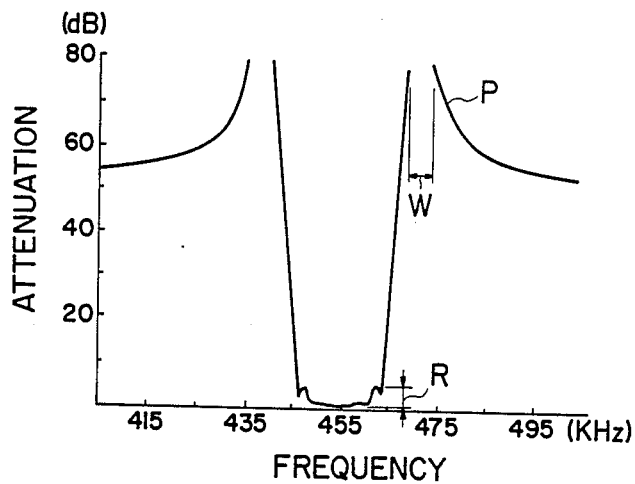
FIG. 3 is a view for explaining the characteristic of a conventional ladder-type ceramic filter.

FIG. 2 is a view showing the filter characteristic of the ladder-type ceramic filter connected and constituted above. As apparent when compared to FIG. 3, the ripple is considerably reduced and the waveform in the pass band is flat. In addition, a plurality of poles P appear. This indicates that the pole width W has been widened.

It is to be noted that this embodiment is such that the difference ΔF between the resonant and antiresonant frequencies is gradually increased from the resonators positioned in the center and it is suitable to make a setting such that the ratio of the frequency difference ΔF in the resonators positioned outside to that in the resonators positioned inside is approximately equal to 1/0.6 to 0.9. The ratio may be varied.

There are ladder-type ceramic filters comprising an odd number of resonators and ones comprising an even number of resonators. In the above-mentioned example, an even number of resonators are provided wherein setting is made such that the differences ΔF between the resonant and antiresonant frequencies in the series and parallel resonators positioned in the center are the same. On the other hand, where an odd number of resonators are provided, it is sufficient to minimize the difference ΔF between the resonant and antiresonant frequencies in the resonator positioned in the center to gradually increase respective frequency differences from the adjacent resonators.

FIG. 4 is a circuit diagram showing another embodiment which has an odd number of resonators, adding another series resonator $S_4$ to the filter of FIG. 1. Assuming to express the difference ΔF of the resonator $S_1$ as $\Delta F_{S1}$ and the difference ΔF of the resonator $P_1$ as $\Delta F_{P1}$, the differences ΔF of the respective resonators for the embodiment of FIG. 4 are determined as follows. Namely, the relationships between the differences ΔF are $\Delta F_{P2} < \Delta F_{S2} < \Delta F_{P1} < \Delta F_{S1}$ towards the input terminal IN and $\Delta F_{P2} < \Delta F_{S3} < \Delta F_{P3} < \Delta F_{S4}$ towards the output terminal OUT, provided that the difference $\Delta F_{P2}$ of the resonator $P_2$, which is positioned at the central portion of the circuit, is a minimum value. Thus, the differences ΔF are arranged in such a manner that the closer to the input and output terminals a resonator is positioned, the larger the difference is.

FIG. 5 is a circuit diagram showing still another embodiment having an even number of series resonators and an even number of parallel resonators thus an even number of resonators in total. In such a case, the differences ΔF are so determined that the resonators $P_2$ and $S_3$, which are positioned at the center of the circuit, have a minimum value in difference. As an alternative for such a case having series and parallel resonators not less than four respectively, the resonators $S_2$, $P_2$, $S_3$ and $P_3$ which are positioned at the center of the circuit may have a minimum value in difference. Because the more the number of resonators are, the less the improvements of characteristics are, comparing a case two resonators positioned at the center have a minimum value in difference to another case four resonators positioned at the center have a minimum value.

[Advantages with the Invention]

In accordance with this invention, the ripple in the pass band is considerably reduced, thus making it possible to prevent deterioration of the distortion factor.

In addition, the number of poles is increased, so that the width of poles is widened. Thus, attenuation of adjacent channels is sufficiently obtained.

What is claimed is:

1. A ladder-type ceramic filter comprising a first plurality of resonators connected in series between an input terminal and an output terminal, the connection points between two of said series resonators and the connection point between a series resonator and said output terminal each defining a junction, and a second plurality of parallel resonators each having one end thereof grounded and another end connected to a respective one of said junctions, said first and second plurality of resonators forming a ladder arrangement between said input and output terminal, each of said resonators having a respective resonant and a respective antiresonant frequency, and a respective frequency difference between said resonant and antiresonant frequencies;

said resonators being arranged such that one or more of said resonators having a minimum frequency difference is positioned in the center of said ladder arrangement and that resonators having increasing frequency differences are placed closer to said input or output terminal in the order of increasing frequency difference.

2. A ladder-type ceramic filter of claim 1, wherein said filter comprises an odd number of series and parallel resonators in total and one resonator positioned at the center has a minimum value of frequency difference, as compared with the remaining resonators.

3. A ladder-type ceramic filter of claim 1, wherein said filter comprises an even number of series and parallel resonators in total and two resonators positioned at the center have a minimum value of frequency difference, as compared with the remaining resonators.

4. A ladder-type ceramic filter of claim 1, wherein said filter comprises at least four series resonators and at least four parallel resonators and four resonators positioned at the center of said ladder arrangement have a minimum value of differences frequency difference, as compared with the remaining resonators.

* * * * *